(12) United States Patent
Crippa et al.

(10) Patent No.: US 7,260,005 B2
(45) Date of Patent: Aug. 21, 2007

(54) DATA BUS ARCHITECTURE FOR A SEMICONDUCTOR MEMORY

(75) Inventors: Luca Crippa, Busnago (IT); Miriam Sangalli, Carugate (IT); Rino Micheloni, Turate (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/281,932

(22) Filed: Nov. 17, 2005

(65) Prior Publication Data

US 2006/0140033 A1    Jun. 29, 2006

(30) Foreign Application Priority Data

Nov. 18, 2004    (IT) .......................... MI2004A2213

(51) Int. Cl.
*G11C 7/00* (2006.01)
(52) U.S. Cl. ........................ 365/203; 365/207; 365/205
(58) Field of Classification Search ................ 365/203, 365/207, 205, 204, 230.03
See application file for complete search history.

(56) References Cited

U.S. PATENT DOCUMENTS

| | | | |
|---|---|---|---|
| 6,351,150 B1 | 2/2002 | Krishnamurthy et al. | |
| 6,442,069 B1 | 8/2002 | Srinivasan et al. | |
| 6,442,089 B1 | 8/2002 | Fletcher et al. | |
| 6,480,434 B1 * | 11/2002 | Lee ............................ | 365/203 |

* cited by examiner

*Primary Examiner*—David Lam
(74) *Attorney, Agent, or Firm*—Lisa K. Jorgenson; Stephen Bongini; Fleit Kain Gibbons Gutman Bongini & Bianco P.L.

(57) ABSTRACT

A semiconductor memory device is provided that includes memory cells, sense amplifiers, signal lines, isolating circuits, and a precharging circuit. Each signal line is coupled to an output of at least one of the sense amplifiers and each of the isolating circuits isolates an associated signal line from the output of the corresponding sense amplifier at least during an evaluating phase of the datum stored in the memory cell. The signal lines include at least two groups of signal lines, arranged such that coupling capacitances between the lines of the first group and the lines of the second group are substantially negligible. The precharging circuit precharges the first group of signal lines to a first voltage level and the second group of signal lines to a second voltage level.

19 Claims, 4 Drawing Sheets

DATA BUS ARCHITECTURE FOR A SEMICONDUCTOR MEMORY

CROSS-REFERENCE TO RELATED APPLICATIONS

This application is based upon and claims priority from prior Italian Patent Application No. MI2004 A 002213, filed Nov. 18, 2004, the entire disclosure of which is herein incorporated by reference.

FIELD OF THE INVENTION

The present invention generally relates to the field of data transmission through data lines forming data buses in integrated circuits (ICs), and more particularly to a data bus architecture for semiconductor memories, such as a non volatile memory of the flash type.

BACKGROUND OF THE INVENTION

In the field of ICs, data buses are often provided for conveying data within the ICs. Particularly, data buses are commonly employed for memory device ICs, for example for non volatile memory devices. Non volatile memory devices are commonly used for storing information that has to be preserved in the absence of an electrical power source supplying the memory device. In particular, a flash memory typically includes a matrix of cells, each one consisting of a MOS transistor with a floating gate. The transistor is programmed by injecting an electrical charge onto the corresponding floating gate; on the contrary, the transistor is erased by removing the electrical charge from the corresponding floating gate. The electrical charge stored on the floating gate of a transistor modifies its threshold voltage, in such a way as to define different conductivity states and, consequently, different logic values. For example, in memory devices storing a single bit per cell, wherein each cell is capable of memorizing a single bit of information, the generic cell can assume two different threshold voltage values (associated with the two logic values "0" and "1"). In memory devices storing two bits per cell, the generic memory cell can instead assume four different threshold voltage values (associated with the four logic values "00", "01", "10", and "11").

The memory device further includes a bit line for each column of the matrix, and a word line for each row. A single cell is placed at the crossing of the bit line with the word line to which the cell belongs.

For a better selectivity in erasing, the matrix of cells can be partitioned in sectors, each one being capable of being individually erased; the various sectors can be positioned in such a way to form column of sectors.

The operation of reading the memory cells includes biasing them according to proper operating conditions, and sensing the (read) current that they drain. Particularly, the operations for sensing the read current are performed by a plurality of sense amplifiers, which are arranged in the proximity of the area in the silicon chip wherein the matrix of memory cells is integrated. Referring for example to a multilevel flash memory device having two bits per cell, the sense amplifier receives a current value corresponding to the conductivity state of the memory cell, and outputs two signals that represent, at the end of the reading operation, the two bits corresponding to the state. When the reading is finished, the two bits are stored (in a volatile way) into two bistable elements (e.g., flip-flops), and transmitted outside the area dedicated to the memory matrix toward output circuits, by two properly driven signal lines. The two signal lines coming from a sense amplifier are arranged side by side with those coming from the other sense amplifiers of the memory device, so as to form a data bus that connects the plurality of sense amplifiers with the output circuits. In the case of a memory that is capable of storing more than two bits per cell, the number of signal lines correspondingly increases.

Each signal line forming the data bus, realized with a metallic material, typically aluminum, is affected by a parasitic capacitive load toward ground and a capacitive coupling with the adjacent signal lines. The capacitive coupling dominates the parasitic capacitive load of the bus (i.e., the parasitic capacitance of the bus lines toward ground), because of the size scaling of the circuit devices due to modern technologies. In particular, the total capacitance due to the contribution of all the lines of the data bus of a memory device may reach a value on the order of hundreds of picofarads (pF).

Because of the high capacitive load of the signal lines belonging to the data bus, the switching of the signal lines involves a high electrical power dissipation, and may provoke electrical noise (for example, voltage spikes) that superimposes on the voltages supplying the circuit. The resulting electrical noise is dangerous, because it is capable of invalidating the reading operation of the cell. The flip-flops connected to the outputs of the sense amplifiers, properly clocked, have, among others, the purpose of avoiding the switching of the signal lines during the reading operations, and the purpose of allowing it only at the end of the reading operations, when the electrical noise is no longer able to interfere with the result of the reading.

The reading operation in certain memory devices is advantageously performed simultaneously on a relatively high number of cells, and a very large data word (e.g., a 128-bit data word) is stored in the flip flops. Such a data word cannot be made available at the outside of the memory all at one time, but the access (of a "synchronous" type, because it is synchronized by the clock signals of the flip-flops) to the data stored in the flip-flops can be performed in a parallel way, for example in groups of 8/16 bits at a time, depending on the parallelism of the memory. Particularly, the output circuits are sequentially connected, by the corresponding signal lines, to the output of 8/16 flip-flops at a time. The delay between the reading of each data group and the subsequent data group depends on the length of the data bus lines, because the output signals of the flip-flops necessitate a propagation time for propagating along the respective signal lines.

The ever-increasing demand for increased reading speeds has therefore lead to placing the flip-flops far from the sense amplifiers, and not near them, i.e., the flip-flops have been positioned in correspondence to the ends of the data bus lines, outside the area dedicated to the memory matrix. In this way, the data stored in the flip-flops connected to the signal lines can be made available to the output circuits more rapidly, without having to wait for the propagation of the signals along the data bus (this propagation occurs only during the first access, when the data word read from the cells has to be stored into the flip-flops).

Conversely, the demand for shorter and shorter asynchronous access times involves the use of architectures providing independent sense amplifier modules per each memory sector, or per groups thereof. Because of the increase in the number of sense amplifiers, if the flip-flops were positioned close to the outputs of the sense amplifiers, the number of necessary flip-flops would drastically increase, with a consequent excessive waste of silicon chip area. By placing the flip-flops at the end of the signal lines of the data bus (which can be common to several memory sectors, through a proper multiplexing), the number thereof can be reduced.

Unfortunately, placing the flip-flops at the end of the signal lines of the data bus makes it no longer possible to take advantage of the flip-flops presence for preventing the signal lines of the data bus from switching during the reading, and it is necessary to take care of the induced electrical noise that superimpose on the supply voltages, caused by the switching of the signal lines during the reading operations because, during the reading operation of a cell, the outputs of the corresponding sense amplifier are not stable. In fact, the outputs can switch several times, or slowly pass from one state to the other before reaching a final logic state (for example, the state "1", typically associated with a voltage value equal to the supply voltage, e.g., Vdd=3V, and the state "0", typically associated with ground). In the absence of flip-flops directly connected to the outputs of the sense amplifiers that "mask" the switching of the signal lines during the reading operation, problems of power consumption and electrical noise are faced, which can critically affect the reading operation itself. In fact, with the parasitic capacitance values, a voltage switching of a signal line of the data bus from ground to the supply voltage of 3 V is capable of producing a high current spike (even as high as 100 mA), with a consequent drop in the supply voltage value, which is capable of invalidate the reading.

Thus, a solution is necessary for the problems of electrical noise and power consumption that is compatible with the placement of the flip-flops so as to be no more directly in correspondence to the sense amplifier outputs, but outside the area dedicated to the memory matrix.

A possible solution is proposed in U.S. Pat. No. 6,442,069, in which a data transmission architecture of differential type is described; in this way, the voltage excursions of the signal lines are limited, and the problems of electrical noise and power consumption are reduced.

We have observed that such a structure is however expensive in terms of silicon chip area. In fact, transmitting the data by differential signals requires adding a reference signal line for each signal line of the data bus, and a final structure for converting the differential signal into a logic signal, with reference to the ground.

A different solution is proposed in U.S. Pat. No. 6,351,150, which provides for transmitting a datum on the signal line only when the datum varies between two readings, so as to reduce the switching. This solution is implemented using a "domino" logic (exploiting timing signals that establish a precharging phase and an evaluation phase of the datum).

However, we have observed that such a structure has the disadvantages of still having a flip-flop connected to the input of each signal line, necessitating a timing signal, and having floating nodes along the signal line, sensitive to possible electrical disturbances.

A further solution is proposed in U.S. Pat. No. 6,442,089, which describes a "differential-domino" logic. In this way no more flip-flops are connected to the input of the signal lines, but this solution has the drawbacks typical of differential transmission (e.g., transmission lines that are duplicated), plus the managing of a system having a timing signal.

SUMMARY OF THE INVENTION

In view of these drawbacks, it is an object of the present invention to overcome these drawbacks and to provide a transmission structure exploiting data buses that reduces the power consumption and the electrical noise.

It is another object of the present invention to provide a data bus architecture that reduces the silicon chip area that is required.

One embodiment of the present invention provides a semiconductor memory device that includes memory cells, sense amplifiers for reading the memory cells, signal lines, isolating circuits and a precharging circuit. Each of the signal lines is coupled to an output of at least one of the sense amplifiers, and each of the isolating circuits isolates one of the signal lines from the output of the sense amplifier to which it is coupled at least during an evaluating phase in which the datum stored in the memory cell is evaluated by the sense amplifier. The precharging circuit precharges the signal lines. The signal lines include at least two groups of the signal lines, arranged such way that coupling capacitances between the signal lines of the first group and the signal lines of the second group are substantially negligible. The precharging circuit precharges the first group of signal lines to a first voltage level and the second group of signal lines to a second voltage level.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1A:
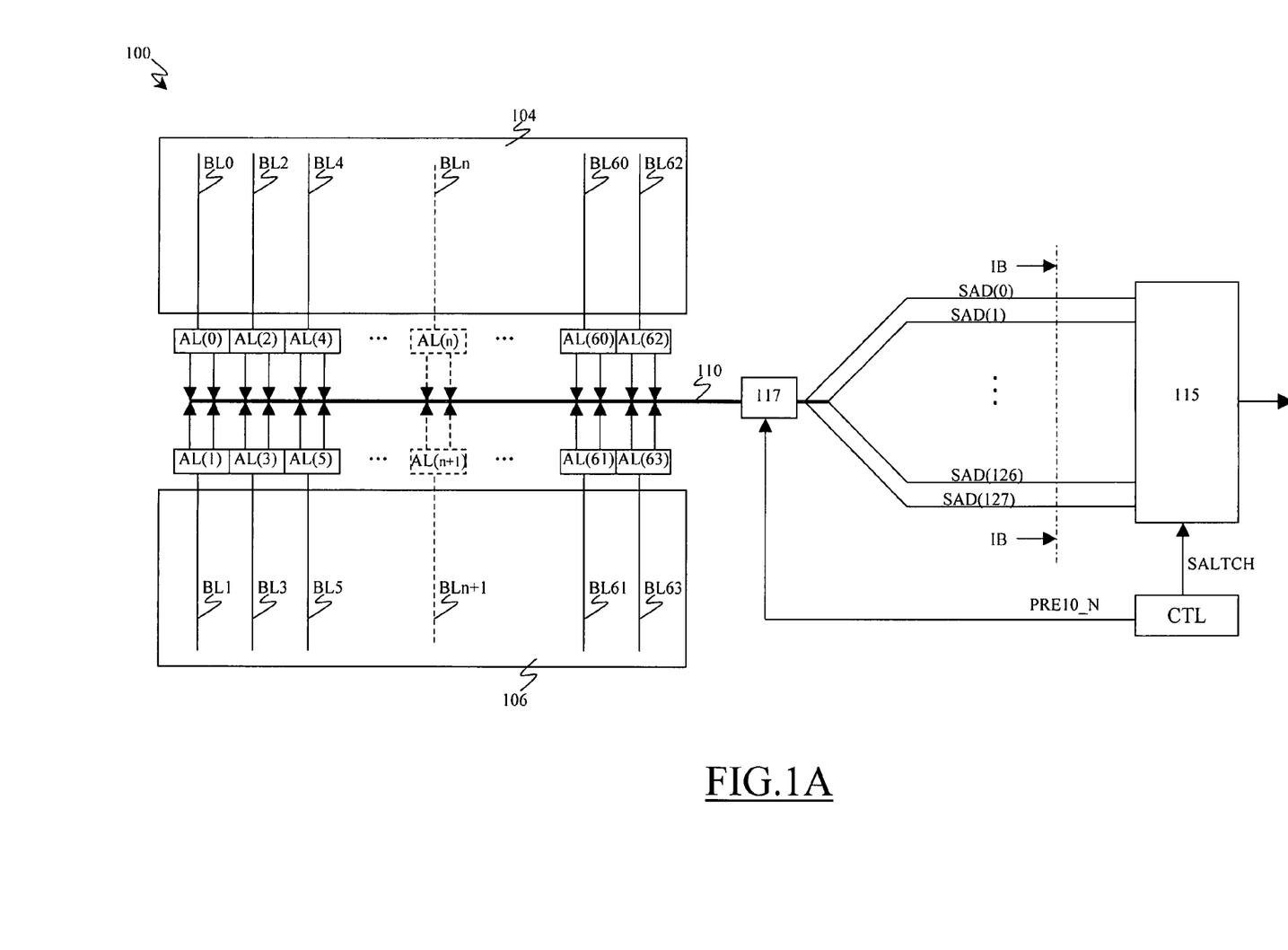
FIG. 1A shows a structure of a memory device with sense amplifiers and a data bus according to an embodiment of the present invention.

FIG. 1A depicts a portion of a memory device 100, for example of the flash type. The flash memory 100 is integrated into a semiconductor material chip; a matrix of memory cells is used for storing data. The memory cells are arranged by rows and columns. In the example shown in the Figure, the matrix of cells has 64 columns, and it is divided into two sub-matrixes 104 and 106. The memory device 100 includes a bit line BLi (I=0, . . . , 63) for each column of the matrix, and each bit line is connectable (by known bit line selecting circuits) with a respective sense amplifier AL(i), for sensing read currents coming from the corresponding bit line BLi.

In this example, the memory device has two bits per cell, i.e., the memory cells are capable of assuming four different threshold voltage values. In particular, the conductivity state of a generic cell can assume four different values, associated with the four logic values "00", "01", "10", and "11". Consequently, the sense amplifier AL(i) has two outputs, each one being associated with an information bit (particularly, a least significant bit, and a most significant bit). The outputs of each sense amplifier AL(i) are connected to a data bus 110, that is formed, in accordance with this example, by 128 signal lines SAD(α) (α=0, . . . , 127). The data bus 110 is connected to a circuit block 115, substantially a non volatile memory register, formed by flip-flops (one for each signal line SAD(α)) that are clocked by a signal SALTCH, which is generated by a control circuit block CTL that controls the memory. The register 115 allows temporary storage of the data coming from the signal lines of the data bus 110, that is subsequently conveyed toward output circuits of the memory. Particularly, the register 115 is situated in a region of the silicon chip that is relatively far from the region in which the sense amplifiers are integrated, outside the area in which the matrix of memory cells is integrated.

The concepts of the present invention are also applicable when the flash memory has a different architecture, and with memory cells that are adapted to be programmed with a different number of levels. In particular, in the case of a memory with cells storing a single bit, each memory cell can assume two different threshold voltage levels. Consequently, each sense amplifier AL(i) requires only a single output, to which an information bit is associated.

Figure 1B:
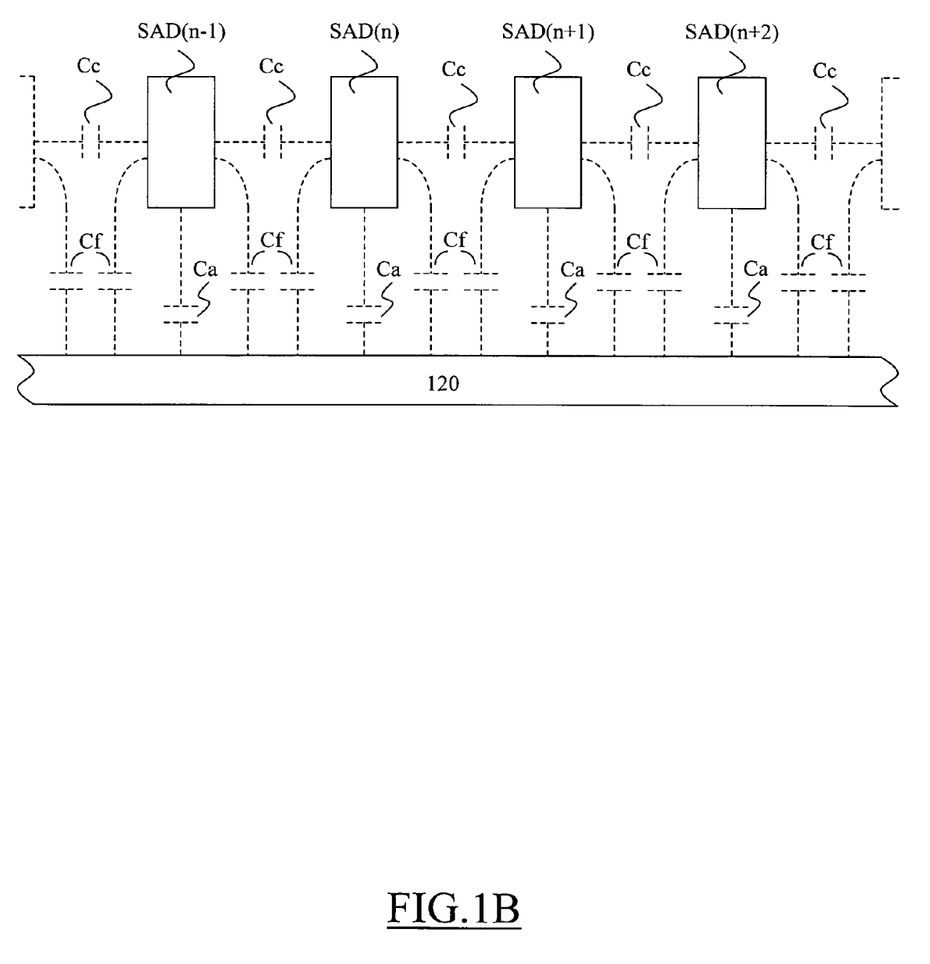
FIG. 1B shows a section of the structure of FIG. 1A.

FIG. 1B shows a sectional view of the structure depicted in FIG. 1A, along the line IB-IB. Each signal line SAD(α) (realized in a metallic material, typically aluminum) of the data bus 110, for example the line SAD(n), has a capacitive coupling with the adjacent signal lines SAD(n−1) and SAD(n+1). The capacitive coupling, caused by distributed capacitive effects, for the sake of simplicity is represented in the Figure by lumped circuit elements, i.e., by coupling capacitances Cc. Furthermore, each signal line of the bus, such as the line SAD(n), has a capacitive coupling toward a ground plane 120 (globally identifying the circuit parts that are at the reference voltage); the capacitive coupling is represented in Figure by lumped circuit elements. Particularly, the capacitance Ca represents the capacitive contribution due to the area of the signal line SAD(n) facing the ground plane 120, while the capacitance Cf represents the capacitive contribution due to the fringing electrical field of the lateral surfaces of the signal line SAD(n) toward ground. As explained above, when the potential of the signal lines varies, this capacitive coupling generates disturbances that superimpose on the supply voltages, and that are capable of invalidating the reading operations of the memory.

For obviating such problems, according to an embodiment of the present invention a signal line driving circuit 117 is provided.

Figure 2:
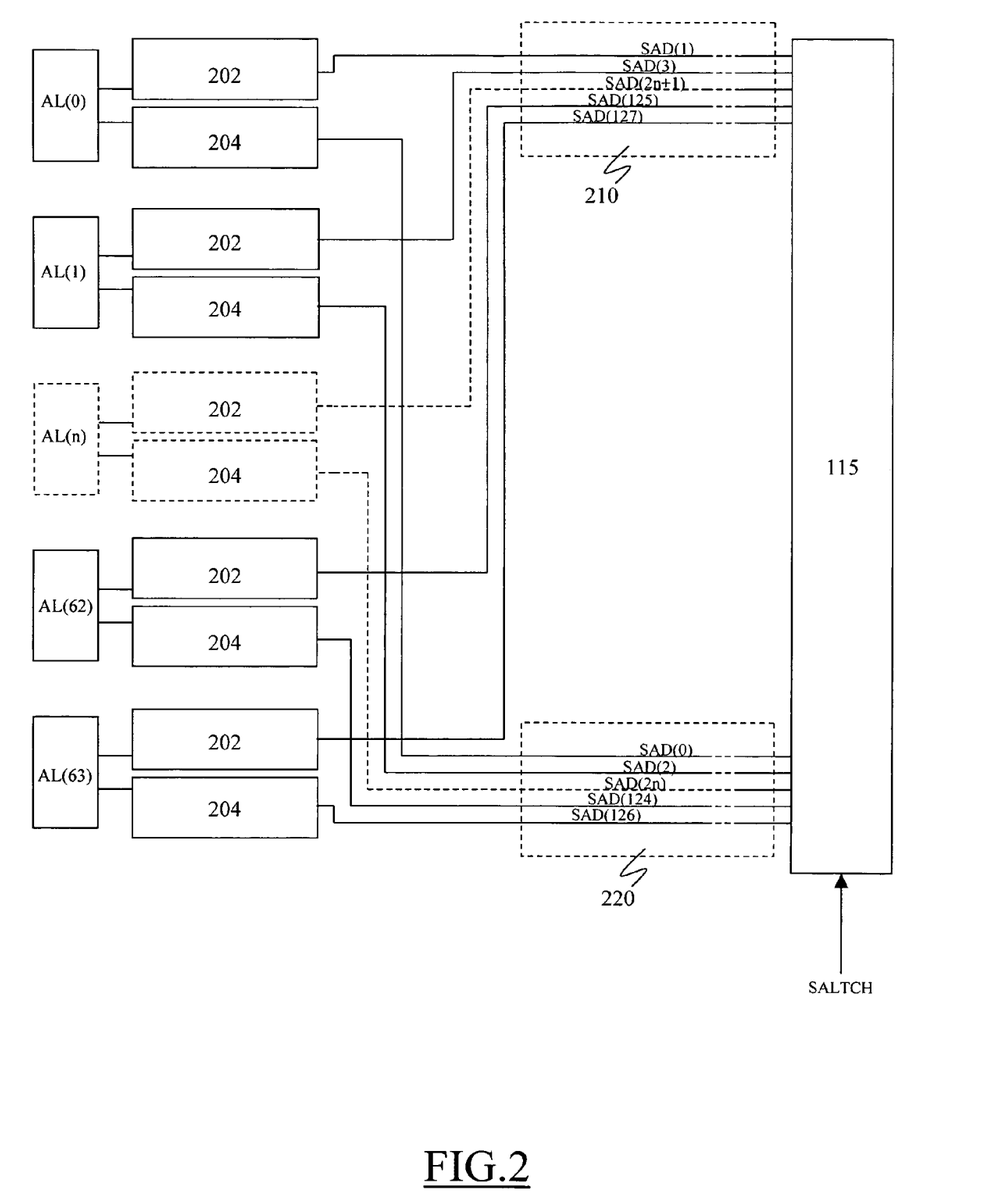
FIG. 2 shows a data bus architecture according to a preferred embodiment of the present invention.

FIG. 2 shows a data bus architecture according to a preferred embodiment of the present invention. Each sense amplifier AL(i) (I=0, . . . , 63), for example the sense amplifier AL(n), has two outputs: the first output is connected to a corresponding "odd" signal line SAD(2 n+1) by a driving circuit 202, while the second output is connected to a corresponding "even" signal line SAD(2n) by a further driving circuit 204. The operation of the driving circuits 202 and 204 is explained below.

The odd signal lines (SAD(1), SAD(3), . . . , SAD(2n+1), . . . , SAD(125), SAD(127)) are grouped in a portion of the data bus 110 whose position on the semiconductor chip is spatially sufficiently far from a further portion 220 of the data bus 110, which is constituted by the even signal lines (SAD(0), SAD(2), . . . , SAD(2n), . . . , SAD(124), SAD(126)), in such a way that the capacitive coupling between the lines of the two portions is negligible. Both the portions 210 and 220 of the data bus are connected to the circuit block 115, which includes a number of flip-flops equal to the number of the signal lines SAD(α).

Figure 3:
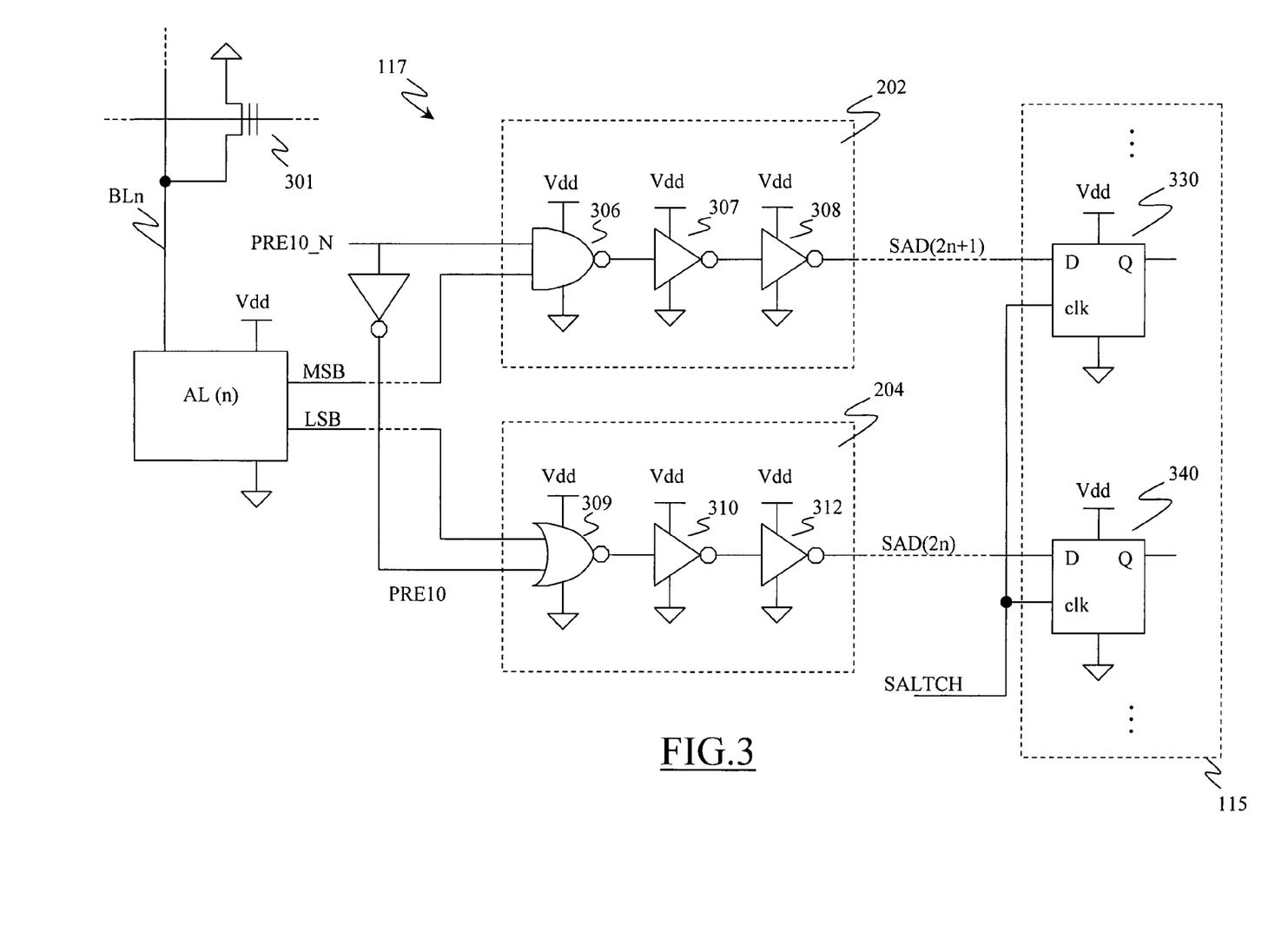
FIG. 3 shows in greater detail the structure of two lines of the data bus of FIG. 2 according to one embodiment of the present invention.

FIG. 3 shows in detail two lines of the data bus of FIG. 2 according to one embodiment of the present invention. Particularly, there is shown the pair of signal lines SAD(2n+1) and SAD(2n) that are connected to the outputs of the respective sense amplifier AL(n), which is supplied by a voltage Vdd and a ground voltage.

A reading of the memory cells will now be described. At the end of the reading operations, the generic sense amplifier AL(n) interprets the conductivity state of the addressed memory cell 301 belonging to the selected bit line BLn, and outputs two signals MSB and LSB representing the values of the 2 bits (most significant and least significant) stored in the memory cell. During the reading operations, the voltage value of the signals MSB and LSB varies, passing through intermediate values between Vdd and ground. The signals MSB and LSB can be considered as "logical" (i.e., they are signals that assume only one of two distinct voltage values, Vdd or ground, each one associated with a logic value, "1" or "0") only when the reading operation is terminated.

The signal MSB is conveyed on the signal line SAD(2n+1) by a driving circuit 202, in this exemplary embodiment formed by three logic gates, that is supplied by the same voltages (Vdd and ground) as the sense amplifier AL(n). A NAND gate 306 and first and second inverters 307 and 308 form the driving circuit 202. Particularly, an input of the NAND gate 306 receives the signal MSB, while the other input receives a precharging signal PRE10_N (provided, for example, by a circuit control block), whose purpose will be made clearer in the following description. The output of the NAND gate 306 is connected to the input of the first inverter 307, which is connected in series with the second inverter 308. The output of the second inverter 308 is connected to a first end of the signal line SAD(2n+1). The second end of the signal line SAD(2n+1) is connected to the input of a respective flip-flop 330, belonging to the circuit block 115, which is clocked by the signal SALTCH.

In a similar way, the signal LSB coming from the sense amplifier AL(n) is conveyed on the signal line SAD(2n) by a further driving circuit 204. Such driving circuit 204 is formed by three logic gates, and is supplied by the same voltages as the sense amplifier AL(n). A NOR gate 309 and third and fourth inverters 310 and 312 for the driving circuit 204. Particularly, an input of the NOR gate 309 receives the signal LSB, while the other input receives a precharging signal PRE10, which assumes complementary values with respect to the precharging signal PRE10_N. The output of the NOR gate 309 is connected to the input of the third inverter 310, which is connected in series with the fourth inverter 312. The output of the fourth inverter 312 is connected to a first end of the signal line SAD(2n). The second end of the signal line SAD(2n) is connected to the input of a flip-flop 340, which is timed by signal SALTCH.

The operation of the driving circuit 202 is as follows. During the reading operation the signals MSB and LSB switch their values passing through intermediate values between Vdd and ground. Consequently, a direct connection of the output of the sense amplifier AL(n) that provides the signal MSB to the signal line SAD(2n+1) of the data bus would propagate the voltage switching on the signal line SAD(2n+1), with a consequent generation of electrical disturbances that superimpose on the supply voltages due to the parasitic capacitive loads. As described in the following in greater detail, such voltage switching on the signal lines SAD(α) determines the generation of noise currents that, together with the non-negligible resistance values of the supply sources of the circuit, provoke voltage spikes that superimpose on the ground voltage, and voltage drops that superimpose on the value of the voltage Vdd. The driving circuit 202 allows the avoidance of such spurious signal switching on the signal line SAD($2n$+1), and thus eliminates the electrical noise. In fact, by keeping the precharging signal PRE10-N at ground (logic level "0") during the reading operation, the signal line SAD($2n$+1) is kept at the voltage Vdd, irrespective of the values assumed by the signal MSB. In other words, the line SAD($2n$+1) is kept isolated from the output of the sense amplifier. Once the reading operation is terminated, the voltage value assumed by the signal MSB represents the correct logic value. At this point, the signal PRE10_N is brought to the voltage Vdd, and the signal line SAD($2n$+1), no more kept at the voltage Vdd, can switch, if necessary, depending on the value assumed by the signal MSB.

In a similar way, in the driving circuit 204, the precharging signal PRE10 is kept at the Vdd value during the reading operation. Consequently, the signal line SAD($2n$) is isolated from the output of the respective sense amplifier, and is kept at the ground voltage, irrespective of the values assumed by the signal LSB. Once the reading operation is finished, the voltage value assumed by the signal LSB represents the correct logic value. At this point, the signal PRE10 is brought to the ground voltage, and the signal line SAD($2n$), no more kept at the ground voltage, can switch, if necessary, depending on the value assumed by the signal LSB.

Thanks to the presence of the driving circuits 202 and 204 and thanks to the timing of the precharging signals PRE10$_{13}$ N and PRE10, switching of the signal lines SAD($2n$+1) and SAD($2n$) is made possible only when the reading is finished. Consequently, the unavoidable electrical disturbances that superimpose on the supply voltages as a consequence of the switching of the signal lines of the data bus, occurs during a phase that can no longer influence the result of the reading of the data by the sense amplifier AL(n).

Thanks to the precharging of the signal lines SAD($2n$+1) and SAD($2n$), which is carried out by the two driving circuits 202 and 204, the highest possible noise on the supply voltages is substantially halved.

Without some precharging operations, in fact, the logic levels, and therefore the voltages of the signal lines of the data bus, would be substantially random (depending on the preceding reading). The highest possible noise on the supply voltages would occur when a signal line SAD($2n$+1) and the adjacent signal line SAD($2n$), being one at the voltage Vdd (or ground) and the other at ground (or at Vdd), have to pass one to ground (or Vdd) and the other to Vdd (or ground), respectively, as a consequence of the reading operation. In this case, the presence of the coupling capacitances Cc between adjacent signal lines would cause a high charge transfer and, consequently, a high current consumption. This would be caused by the potential difference experienced by the coupling capacitance Cc that passes from Vdd (or −Vdd) to −Vdd (or Vdd), i.e., that experiences an excursion equal to 2Vdd.

By precharging all the odd signal lines SAD($2n$+1) to the voltage Vdd, when the reading phase of the sense amplifiers is terminated, the odd signal lines SAD($2n$+1) can remain at the voltage Vdd, or monotonically discharge toward ground. Consequently, the highest possible noise that superimposes on the supply voltages (in this case, a voltage spike that superimposes on the ground voltage) is halved with respect to the preceding case because the highest excursion of the potential difference experienced by the coupling capacitance Cc is limited by Vdd.

In the same way, by precharging all the even signal lines SAD($2n$) to the ground voltage, when the reading phase of the sense amplifiers is terminated, the even signal lines SAD($2n$) can remain at the ground voltage, or monotonically change to the voltage Vdd. Consequently, an electrical noise that superimposes on the voltage value Vdd provided by the supply is generated; such noise is halved with respect to the case without precharging, because the highest excursion of the potential difference experienced by the coupling capacitance Cc is again limited to Vdd.

Because the two data bus portions 210 and 220 are properly spatially spaced apart, the capacitive couplings (represented by coupling capacitances Cc) among the signal lines of one of the two bus portions, precharged to the Vdd voltage, and the signal lines of the other bus portion, precharged to the ground voltage, are negligible, and the disturbances that would be generated by the possible high excursion of the potential difference experienced by the coupling capacitance Cc are avoided, as previously explained.

According to such a structure, the electrical disturbances are equally distributed between supply and ground. Particularly, the switching of the signal lines belonging to the data bus portion 210, being precharged to a voltage value Vdd during the read operation, causes electrical disturbances that superimpose on the ground voltage. The switching of the signal lines belonging to the bus portion 220 causes instead electrical disturbances that superimpose on the voltage Vdd.

If instead all the even and odd signal lines SAD($\alpha$) would be precharged to the same voltage value (Vdd or ground), the highest disturbance that superimposes on the supply voltages would still be halved with respect to the case without precharging, but no more equally distributed between the voltage Vdd and the ground.

The teachings provided by the present invention are applicable independently from the number of bits per memory cell. For example, in the case of a memory with one bit per cell, in which each sense amplifier AL(i) has only one output, it is possible to equally distribute the electrical disturbances between supply and ground. For example, in this case the signal lines SAD($\alpha$) are grouped in two groups (for example, in a first group of signal lines SAD($\alpha$) corresponding to sense amplifiers AL(i) having even indexes, and in a second group of signal lines SAD($\alpha$) corresponding to sense amplifiers AL(i) having odd indexes) that are spatially far apart, and the precharging of the lines of the two groups is performed by the same driving circuits 202 and 204.

In any case, the concepts of the present invention are also applicable when the driving circuit is implemented with an equivalent combinatory circuit, when the logic gates are interconnected in other ways, when other logic gates are used, and so on. For example, the number of inverters connected in series may be higher than two.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor memory device comprising:
a plurality of memory cells;
a plurality of sense amplifiers coupled to the memory cells;
a plurality of signal lines, each of the signal lines being coupled to an output of at least one of the sense amplifiers;
a plurality of isolating circuits, each of the isolating circuits being associated with one of the signal lines and isolating that signal line from the output of the sense amplifier to which it is coupled during an evaluating phase in which a datum stored in one of the memory cells is evaluated by that sense amplifier; and
a precharging circuit for precharging the signal lines;
wherein the plurality of signal lines comprises at least a first group of the signal lines and a second group of the signal lines, arranged such that coupling capacitances between the signal lines of the first group and the signal lines of the second group are substantially negligible, and
the precharging circuit precharges the signal lines of the first group to a first voltage level and precharges the signal lines of the second group to a second voltage level, which is different than the first voltage level.

2. The memory device of claim 1, wherein the signal lines of the first group are spatially distant from the signal lines of the second group.

3. The memory device of claim 1, wherein the first voltage level corresponds to a first logic level and the second voltage level corresponds to a second logic level.

4. The memory device of claim 3,
wherein the precharging circuit is connected to the signal lines of the first and second groups, and
the precharging circuit comprises the isolating circuits.

5. The memory device of claim 4, wherein the precharging circuit includes logic gates that receive as supply voltages the first and second voltage levels.

6. The memory device of claim 5, wherein the logic gates of the precharge circuit comprise:
an AND gate for each of the signal lines of the first group; and
an OR gate for each of the signal lines of the second group.

7. The memory device of claim 6,
wherein each of the AND gates has a first input terminal connected to the output of the corresponding sense amplifier, a second input terminal receiving a first precharging signal, and an output terminal coupled to the corresponding signal line of the first group, and
each of the OR gates has a first input terminal connected to the output of the corresponding sense amplifier, a second input terminal receiving a second precharging signal, and an output terminal coupled to the corresponding signal line of the second group.

8. The memory device of claim 7, wherein the first and second precharging signals maintain the signal lines of the first group at the first voltage level and the signal lines of the second group at the second voltage level during the evaluating phase.

9. The memory device of claim 1, wherein each of the signal lines is connected to an input terminal of a bistable element that stores in a volatile manner a datum provided by the signal line.

10. A method comprising the steps of:
providing a semiconductor memory device that includes:
a plurality of memory cells;
a plurality of sense amplifiers coupled to the memory cells;
a plurality of signal lines, each of the signal lines being coupled to an output of at least one of the sense amplifiers; and
a plurality of isolating circuits, each of the isolating circuits being associated with one of the signal lines and isolating that signal line from the output of the sense amplifier to which it is coupled during an evaluating phase in which a datum stored in one of the memory cells is evaluated by that sense amplifier;
arranging the signal lines in at least two groups such that coupling capacitances between the signal lines of the first group and the signal lines of the second group are substantially negligible; and
holding the signal lines to either a first level or a second voltage level during the evaluating phase, the first voltage level corresponding to a first logic level and the second voltage level corresponding to a second logic level,
wherein the holding step includes the sub-steps of:
precharging the signal lines of the first group to the first voltage level; and
precharging the signal lines of the second group to the second voltage level.

11. The method of claim 10, wherein the arranging step comprises locating the signal lines of the first group spatially distant from the signal lines of the second group.

12. The method of claim 10, further comprising the step of storing a datum provided by each of the signal lines in a bistable element.

13. An information processing system including at least one semiconductor memory device, the memory device comprising:
a plurality of memory cells;
a plurality of sense amplifiers coupled to the memory cells;
a plurality of signal lines, each of the signal lines being coupled to an output of at least one of the sense amplifiers;
a plurality of isolating circuits, each of the isolating circuits being associated with one of the signal lines and isolating that signal line from the output of the sense amplifier to which it is coupled during an evaluating phase in which a datum stored in one of the memory cells is evaluated by that sense amplifier; and
a precharging circuit for precharging the signal lines;
wherein the plurality of signal lines comprises at least a first group of the signal lines and a second group of the signal lines, arranged such that coupling capacitances between the signal lines of the first group and the signal lines of the second group are substantially negligible, and
the precharging circuit precharges the signal lines of the first group to a first voltage level and precharges the signal lines of the second group to a second voltage level, which is different than the first voltage level.

14. The information processing system of claim 13, wherein in the memory device, the signal lines of the first group are spatially distant from the signal lines of the second group.

15. The information processing system of claim 13, wherein in the memory device, the first voltage level corresponds to a first logic level and the second voltage level corresponds to a second logic level.

16. The information processing system of claim 15, wherein the precharging circuit of the memory device is connected to the signal lines of the first and second groups.

17. The information processing system of claim 16, wherein the precharging circuit of the memory device includes logic gates that receive as supply voltages the first and second voltage levels.

18. The information processing system of claim 17, wherein the logic gates of the precharge circuit of the memory device comprise:

an AND gate for each of the signal lines of the first group; and an OR gate for each of the signal lines of the second group.

19. The information processing system of claim 1, wherein each of the signal lines of the memory device is connected to an input terminal of a bistable element that stores in a volatile manner a datum provided by the signal line.

* * * * *